United States Patent
Nam et al.

(10) Patent No.: US 12,334,933 B2
(45) Date of Patent: Jun. 17, 2025

(54) POWER MANAGEMENT INTEGRATED CIRCUIT

(71) Applicant: SAMSUNG ELECTRONICS CO., LTD., Suwon-si (KR)

(72) Inventors: Hyun Seok Nam, Suwon-si (KR); Jin Gyu Kang, Suwon-si (KR); Jeong Woon Kong, Suwon-si (KR); Yong Seong Roh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/119,995

(22) Filed: Mar. 10, 2023

(65) Prior Publication Data

US 2023/0361764 A1 Nov. 9, 2023

(30) Foreign Application Priority Data

May 3, 2022 (KR) .................. 10-2022-0054909

(51) Int. Cl.
*H03K 5/133* (2014.01)
*H03K 5/00* (2006.01)
*H03K 5/135* (2006.01)

(52) U.S. Cl.
CPC ......... *H03K 5/133* (2013.01); *H03K 5/00006* (2013.01); *H03K 5/135* (2013.01); *H03K 2005/00065* (2013.01)

(58) Field of Classification Search
None
See application file for complete search history.

(56) References Cited

U.S. PATENT DOCUMENTS

| | | | |
|---|---|---|---|
| 6,043,717 A | 3/2000 | Kurd | |
| 7,373,527 B2 | 5/2008 | Chapuis | |
| 7,518,263 B2 | 4/2009 | Gan et al. | |
| 9,270,189 B2 | 2/2016 | Rosado et al. | |
| 9,991,780 B2 | 6/2018 | Kuo et al. | |
| 10,069,423 B2 | 9/2018 | Hussain et al. | |
| 11,082,050 B2 * | 8/2021 | Nam | H02M 3/156 |

(Continued)

FOREIGN PATENT DOCUMENTS

| | | |
|---|---|---|
| EP | 1 109 303 | 6/2001 |
| JP | 2011-147269 | 7/2011 |

OTHER PUBLICATIONS

European Search report issued on Sep. 29, 2023 in corresponding European application No. EP 23 171 151.6.

(Continued)

*Primary Examiner* — Cassandra F Cox
(74) *Attorney, Agent, or Firm* — MORGAN, LEWIS & BOCKIUS LLP

(57) ABSTRACT

A power management integrated circuit including: a clock generator that generates an input clock; a first phase delay controller that delays the input clock by a first phase and outputs a first supply clock to a first switching converter; a second phase delay controller that delays the input clock by a second phase and outputs a second supply clock to a second switching converter; and a third phase delay controller that delays the input clock by a third phase and outputs a third supply clock to a third switching converter, wherein the first phase, the second phase and the third phase have different phases from each other.

20 Claims, 16 Drawing Sheets

(56) References Cited

U.S. PATENT DOCUMENTS

| | | | |
|---|---|---|---|
| 11,239,794 B2 | 2/2022 | Shin | |
| 2003/0201813 A1 | 10/2003 | Alvandpour et al. | |
| 2006/0140024 A1* | 6/2006 | Lee ..................... | H03L 7/0812 |
| | | | 365/194 |
| 2018/0115236 A1* | 4/2018 | Wibowo ................. | H02M 1/15 |
| 2020/0395854 A1 | 12/2020 | Yao et al. | |
| 2021/0333819 A1 | 10/2021 | Mannes Hillesheim et al. | |

OTHER PUBLICATIONS

1st OA issued on Oct. 11, 2023 in corresponding European application No. EP 23 171 151.6.

* cited by examiner

POWER MANAGEMENT INTEGRATED CIRCUIT

This application claims priority under 35 U.S.C. § 119 to Korean Patent Application No. 10-2022-0054909 filed on May 3, 2022 in the Korean Intellectual Property Office, the disclosure of which is incorporated by reference herein in its entirety.

1. TECHNICAL FIELD

The present inventive concept relates to a power management integrated circuit.

2. DESCRIPTION OF THE RELATED ART

An electronic device such as a smartphone or a tablet personal computer (PC) may operate using power supplied from a battery. A power management integrated circuit (e.g., a power management IC or PMIC) may transfer power supplied from the battery to various components (e.g., a processor, a memory or a communication chip) inside the electronic device. The battery inside the electronic device may be charged through an external power source.

The power management integrated circuit may include a plurality of switching converters to output a constant voltage to be applied to a load. For example, the power management integrated circuit may include several DC/DC converters. Since each switching converter operates according to an operating clock of a constant frequency through an internal clock generator, undesired events such as a switching noise, an increased capacitance of input filter capacitors, and an electromagnetic interference (EMI) may occur.

In particular, due to the EMI, there may be an error in the power management integrated circuit level, and more particularly, in an electronic device equipped with the power management integrated circuits (e.g., home appliances, mobile products, automotive systems, etc.). In an effort to prevent the EMI, the operating clock may be supplied by the use of a separate phase delay controller; however, the phase needs to be accurately adjusted in consideration of an increase in the number of switching converters and environmental factors such as temperature, process, and voltage.

SUMMARY

Embodiments of the present inventive concept provide a power management integrated circuit having high accuracy and precision.

Embodiments of the present inventive concept also provide a power management integrated circuit that supplies clocks having different phases from each other.

An embodiment of the present inventive concept provides a power management integrated circuit including: a clock generator that generates an input clock; a first phase delay controller that delays the input dock by a first phase and outputs a first supply dock to a first switching converter; a second phase delay controller that delays the input clock by a second phase and outputs a second supply clock to a second switching converter; and a third phase delay controller that delays the input clock by a third phase and outputs a third supply dock to a third switching converter, wherein the first phase, the second phase and the third phase have different phases from each other.

An embodiment of the present inventive concept provides a power management integrated circuit including: a clock generator that generates an input clock; a digital logic circuit that generates first and second delay signals; a first phase delay controller that delays the input clock by a first phase according to the first delay signal and outputs a first supply clock to a first switching converter; and a second phase delay controller that delays the input clock by a second phase according to the second delay signal and outputs a second supply clock to a second switching converter, wherein the first supply clock and the second supply clock are adjusted to the first and second phase delay controllers.

An embodiment of the present inventive concept provides a power management integrated circuit including: a first phase delay controller that delays an input clock by a first phase to generate a first supply clock; a first switching converter that performs a voltage conversion based on the first supply clock; a second phase delay controller that delays the input clock by a second phase to generate a second supply clock; and a second switching converter that performs voltage conversion based on the second clock supply.

DETAILED DESCRIPTION OF THE EMBODIMENTS

Figure 1:
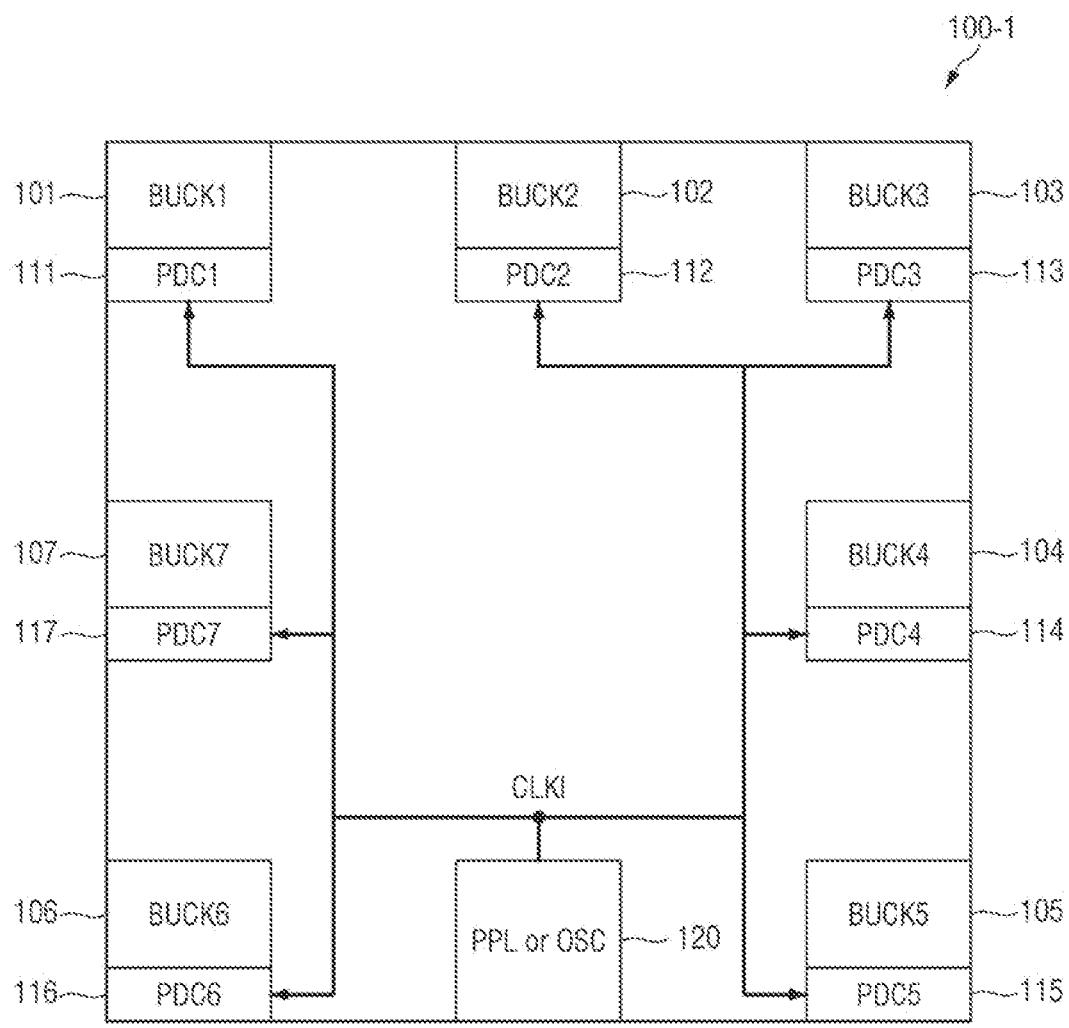
FIG. 1 is a diagram showing a power management integrated circuit according to some embodiments of the present inventive concept.

A power management integrated circuit according to some embodiments of the present inventive concept may be implemented in an electronic device. The electronic device may be a device that includes communication functions. For example, the electronic device may be one or combinations of various devices such as a smartphone, a tablet personal computer (tablet PC), a mobile phone, an image phone, an e-book reader, a desktop PC, a laptop PC, a netbook computer, a personal digital assistant (PDA), a portable multimedia player (PMP), an MP3 player, a mobile medical device, an electronic bracelet, an electronic necklace, an electronic accessory, a camera, a wearable device, an electronic clock, a wrist watch, home appliance (e.g., a refrigerator, an air conditioner, a cleaner, an oven, a microwave oven, a washing machine, an air purifier, etc.), an artificial intelligence robot, a TV, a digital video disc (DVD) player, audio equipment, various medical equipment (e.g., magnetic resonance angiography (MRA), magnetic resonance imaging (MRI), computed tomography (CT), imaging equipment, ultrasound equipment, etc.), a navigation device, a global positioning system receiver (GPS receiver), an event data recorder (EDR), a flight data recorder (FDR), a set-top box, a TV box (e.g., Samsung HomeSync™, Apple TV™, or Google TV™), an electronic dictionary, an automotive infotainment device, an electronic equipment for ship (e.g., a navigation device for ships, a gyrocompass, etc.), avionics, security equipment, electronic clothing, an electronic key, a camcorder, a game console, a head-mounted display (HMD), a flat panel display device, an electronic frame, an electronic album, pieces of furniture or buildings/structures including communication functions, an electronic board, an electronic signature input device, a wearable device, or a projector. Those skilled in the art will appreciate that electronic devices according to various embodiments of the present inventive concept are not limited to the devices described above.

The power management integrated circuit according to some embodiments of the present inventive concept will be described below referring to FIGS. 1 to 16. In the drawings, like reference numerals refer to like elements.

FIG. 1 is a diagram showing a power management integrated circuit according to some embodiments of the present inventive concept.

Referring to FIG. 1, a power management integrated circuit 100-1 according to some embodiments may include a plurality of switching converters 101, 102, 103, 104, 105, 106 and 107, phase delay controllers 111, 112, 113, 114, 115, 116 and 117 (hereinafter indicated by 110), a clock generator 120, and a digital logic 130.

The clock generator 120 generates a main clock used in the power management integrated circuit 100-1, in other words, an input clock CLKI having a preset operating frequency. According to some embodiments, the clock generator 120 may be either an oscillator or a main phase delay controller.

The input clock CLKI is input from the clock generator 120 to each of the plurality of phase delay controllers 110. The phase delay controller 110 provides the switching converters 101 to 107 with a supply clock CLKO obtained by delaying the phase of the input clock CLKI. The phase delay controller 110 may generate the supply clock CLKO by delaying the phase of the input clock CLKI so that each of the switching converters 101 to 107 has a different phase.

The phase delay controller 110 may be implemented by a corresponding number of switching converters 101 to 107 according to some embodiments, or may be implemented by the smaller number of the switching converters 101 to 107 according to some embodiments.

According to some embodiments, the switching converters 101 to 107 may be one of a buck converter, a boost converter, or buck-boost converter.

Figure 2:
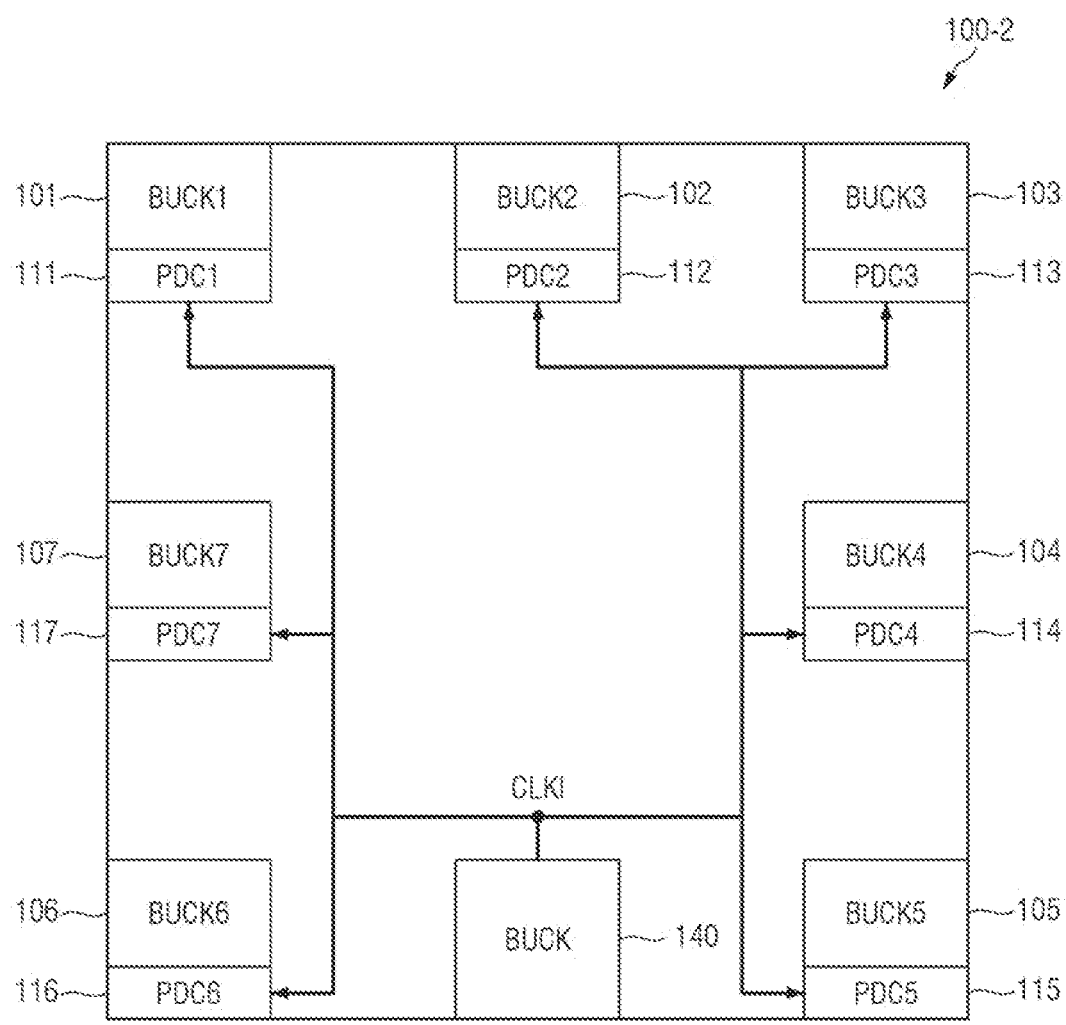
FIG. 2 is a diagram showing a power management integrated circuit according to some embodiments of the present inventive concept.

FIG. 2 is a diagram showing a power management integrated circuit according to some embodiments of the present inventive concept. For the sake of convenience, repeated description of contents of FIG. 1 will not be provided.

Referring to FIG. 2, a clock generator 140 of a power management integrated circuit 100-2 may be implemented by a main switching converter unlike the clock generator 120 of FIG. 1. The main switching converter 140 may be, for example, a buck converter, a boost converter or a buck-boost converter.

Figure 3:
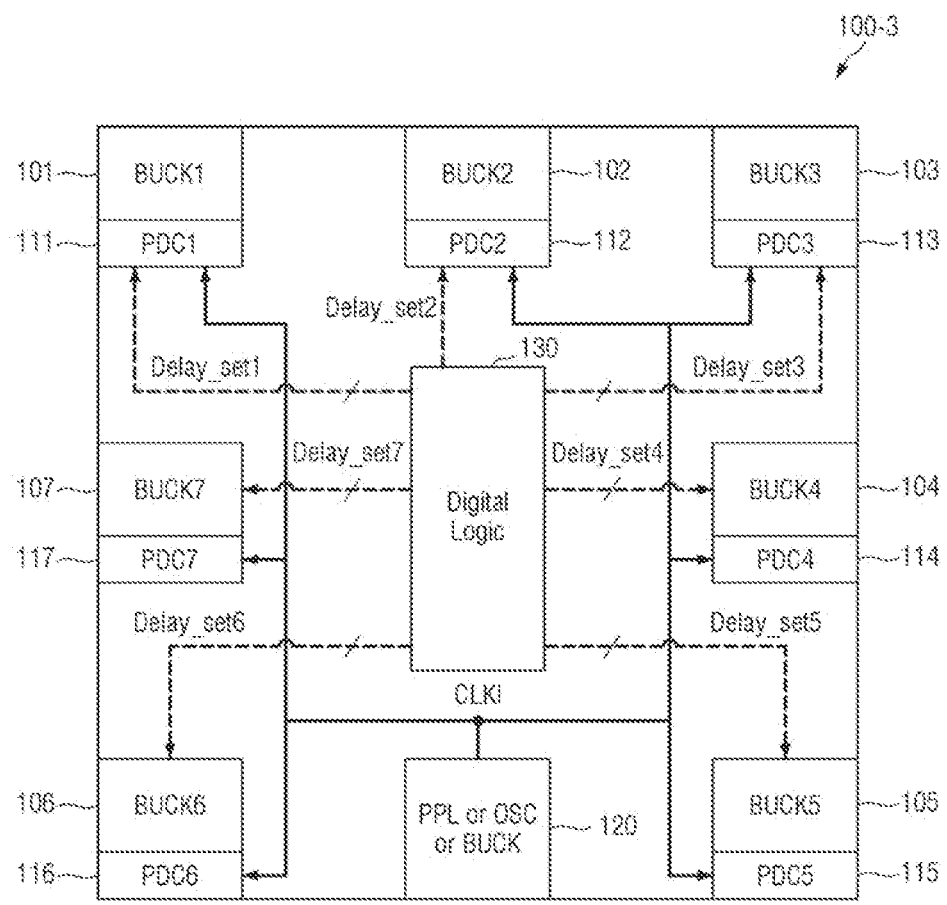
FIG. 3 is a diagram showing a power management integrated circuit according to some embodiments of the present inventive concept.
Figure 4:
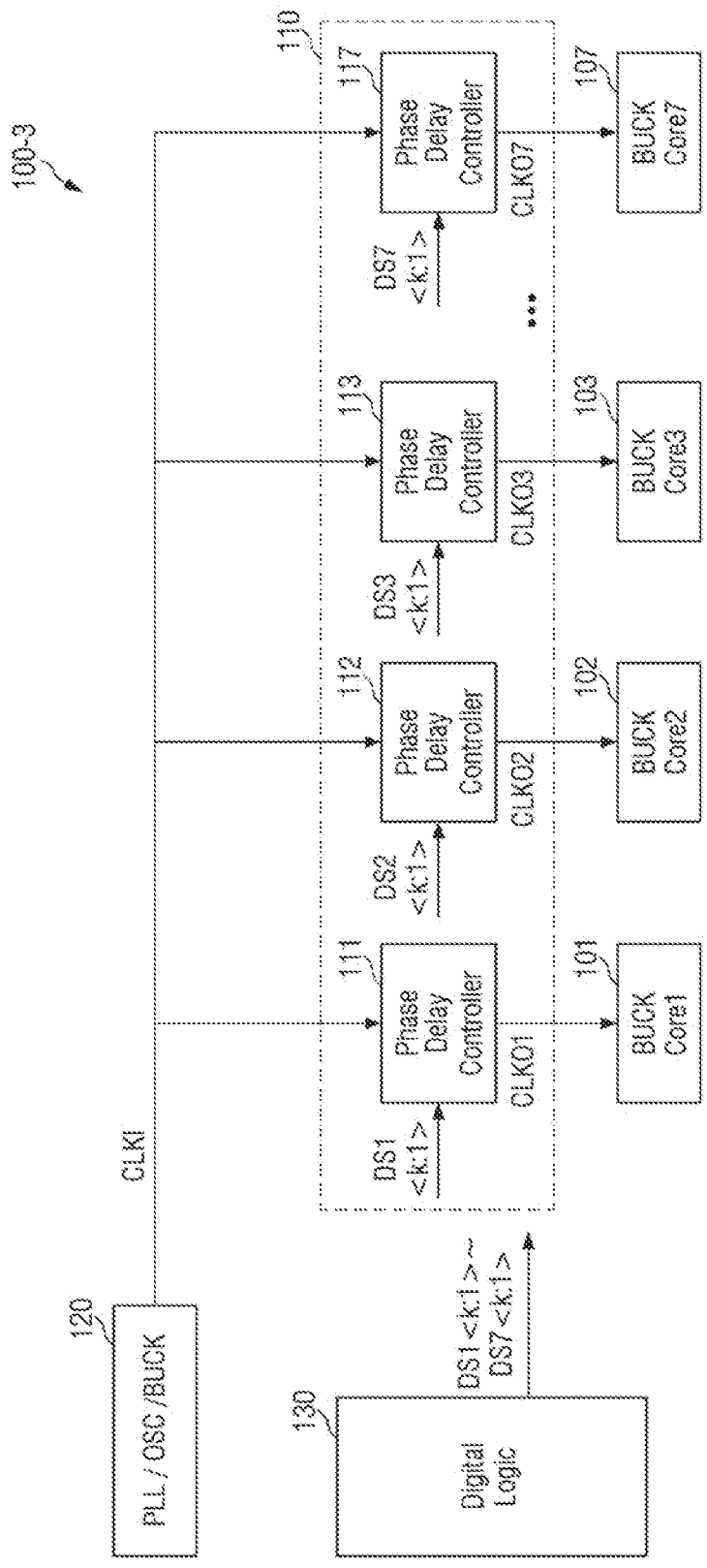
FIG. 4 shows a phase delay controller according to some embodiments of the present inventive concept.
Figure 5:
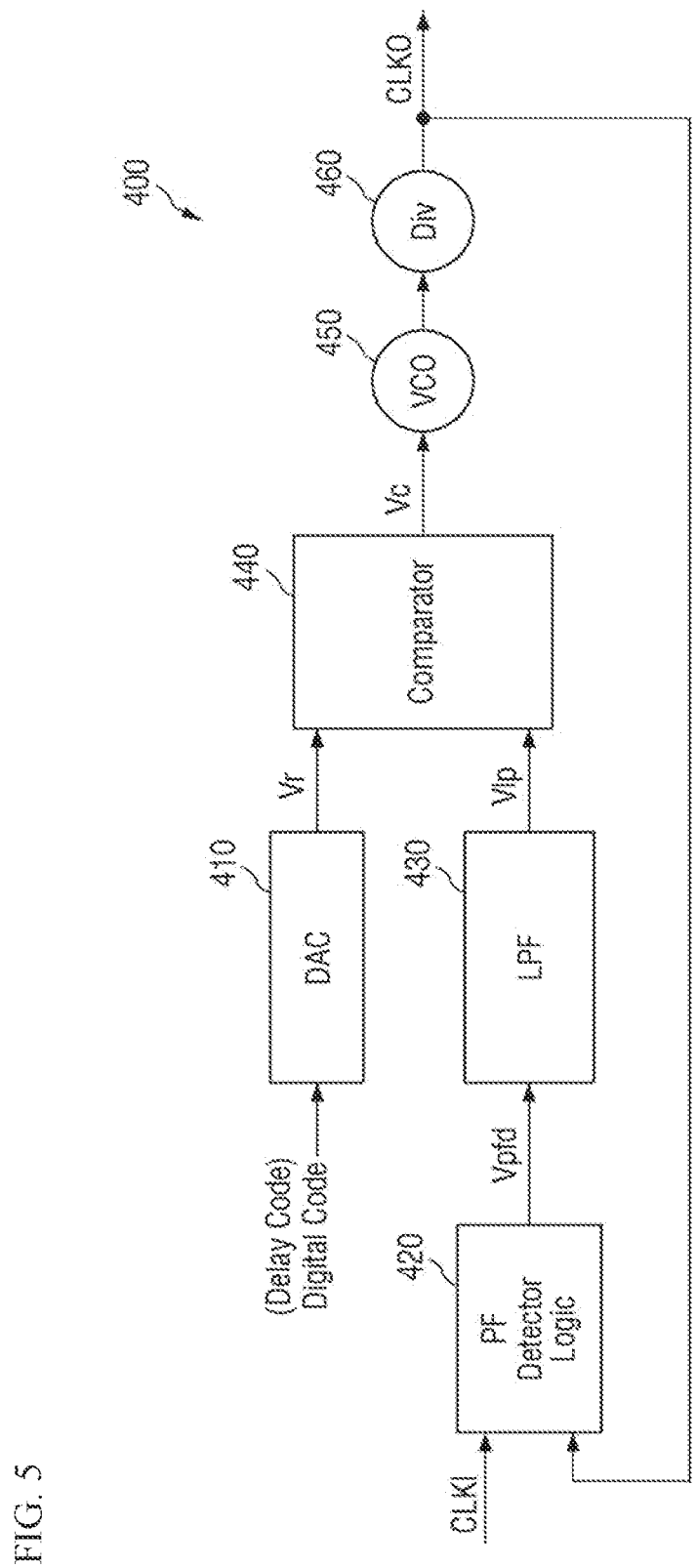
FIG. 5 shows the phase delay controller of FIG. 4 in more detail.

FIG. 3 is a diagram showing a power management integrated circuit according to some embodiments of the present inventive concept. For the sake of convenience, repeated description of contents of FIG. 1 will not be provided. FIG. 4 shows a phase delay controller according to some embodiments, and FIG. 5 shows the phase delay controller of FIG. 4 in more detail.

Referring to FIGS. 3 and 4, a power management integrated circuit 100-3 may further include a digital logic circuit 130 that outputs a selection signal to each of the phase delay controllers 111 to 117, unlike FIG. 1 or 2. The selection signal may be a digital signal according to some embodiments or an analog signal according to some embodiments.

The phase delay controllers 111 to 117 are provided with the input clock CLKI: from the clock generator 120, and are provided with delay codes (Delay_set 1, Delay_set 2, Delay_set 3, Delay_set 4, Delay_set 5, Delay_set 6, and 7) as selection signals from the digital logic circuit 130. In other words, the selection signals output from the digital logic circuit 130 are delay codes (Delay_set 1 to 7). For example, in the examples shown in FIGS. 3 and 4, the digital logic circuit 130 may output delay codes (Delay_set 1 to 7) to the phase delay controllers 111 to 117. The delay code may be at least two or more multi-bits as a digital signal (in the shown example, k bits<k:1>, where k is a natural number of 2 or more).

The phase delay controllers 111 to 117 may provide the switching converters 101 to 107 with phase delays corresponding to the delay codes Delay_set 1 to 7 <k:1> of the input clock CLKI.

In an embodiment, the phase delay controllers 111 to 117 may be implemented like phase delay controller 400 of FIG. 5. The phase delay controller 400 may include a digital analog converter 410, a phase frequency detector 420, a comparator 440, and a voltage controlled oscillator (VCO) 450.

The digital analog converter 410 generates a comparison voltage Vr corresponding to the delay code. The phase frequency detector 420 receives the input clock CLKI and the supply clock CLKO fed back from an output terminal of the phase delay controller 400, and generates a detection voltage Vpfd corresponding to a frequency difference and a phase difference between the input clock CLKI and the supply clock CLKO.

The comparator 440 compares the detection voltage Vpfd and the comparison voltage Vr and outputs a comparison result Vc, and the VCO 450 outputs the supply clock CLKO according to the comparison result Vc of the comparator 440.

According to some embodiments, the phase delay controller 400 may further include a low pass filter unit 430. The detection voltage Vpfd output from the phase frequency detector 420 may be subjected to low pass filtering. In other words, an average of initial detection voltages Vpfd generated and output by the phase frequency detector 420 is generated as a filtered detection voltage Vlp.

According to some embodiments, the phase delay controller 400 may further include a frequency distribution circuit 460 at the output terminal. Depending on the operating frequencies required by the connected switching converters 101 to 107, the frequency distribution circuit 460 may divide the initial supply clock CLKO output from the VCO 450 to match the switching converters 101 to 107.

Figure 6:
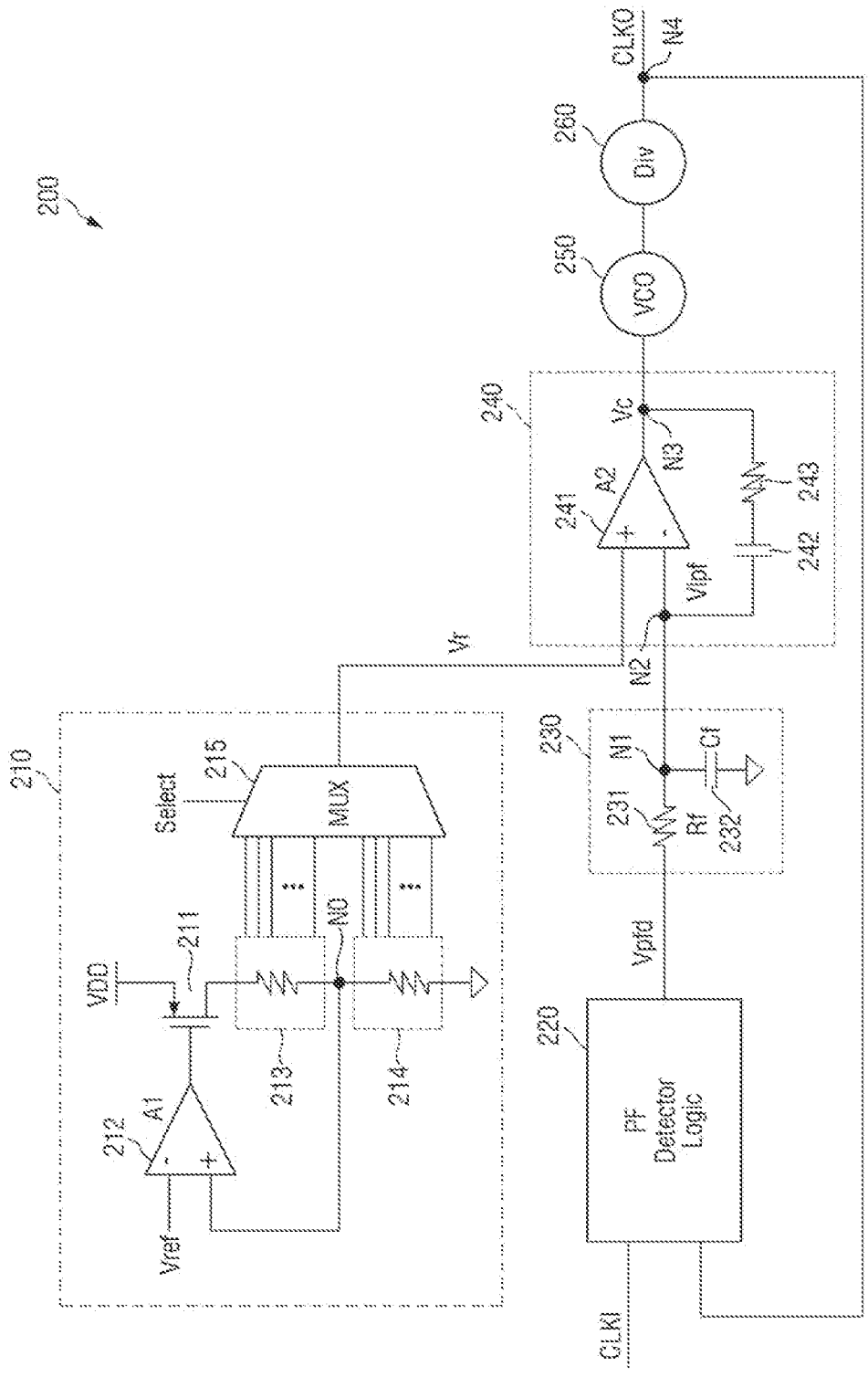
FIG. 6 is a circuit diagram showing an example of the phase delay controller shown in FIG. 5.

FIG. 6 is a circuit diagram showing an embodiment of the phase delay controller shown in FIG. 5.

Referring to FIG. 6, a phase delay controller 200 includes a comparison voltage generator 210, a phase frequency detector 220, a comparator 240, and a voltage-controlled oscillator (hereinafter, VCO) 250.

The comparison voltage generator 210 generates a comparison voltage Vr for delaying the input clock CLKI by a target delay phase difference. The comparison voltage generator 210 includes a positive-channel metal oxide semiconductor (PMOS) transistor 211, a comparator 212, a first resistor string 213, a second resistor string 214 and a multiplexer 215.

The PMOS transistor 211 has a source terminal connected to a power supply voltage terminal VDD and a drain terminal connected to one end of the first resistor string 213. The first resistor string 213 is connected between the drain terminal of the PMOS transistor 111 and a feedback node N0, and the second resistor string 214 is connected between the feedback node N0 and a ground voltage terminal GND. Although each of the first resistor string 213 and the second resistor string 214 is shown as a single resistor, a plurality of resistors may be connected in series and a switch may be connected for each resistor of the first and second resistor strings 213 and 214.

The comparator 212 may compare the voltage of the feedback node N0 with a preset reference voltage Vref and output a voltage as a result of the comparison. The PMOS transistor 211 may output a drain voltage corresponding to the output voltage of the comparator 212.

The multiplexer 215 may connect or short the resistors of the first resistor string 213 and the second resistor string 214 according to a selection signal (Select). The voltage of the feedback node N0 may be changed by the switching connection between the first resistor string 213 and the second resistor string 214. In other words, the multiplexer 215 may generate the comparison voltage Vr corresponding to the selection signal (Select).

The selection signal (Select) may have a fixed value for each of the phase delay controllers 111 to 117 of FIG. 1 according to some embodiments, or may be a signal that is transmitted from the digital logic circuit 130 according to some embodiments.

The phase frequency detector 220 compares the input clock CLKI with the supply clock CLKO fed back from the output terminal of the phase delay controller 200, and generates a phase difference and a frequency difference as a detection voltage Vpfd.

The comparator 240 compares the comparison voltage Vr with the detection voltage Vpfd. In other words, the comparator 240 feeds back the phase difference between the input clock CLKI and the supply clock CLKO to match a preset phase difference. According to some embodiments, the comparator 240 may include a comparator 241 which receives the detection voltage Vpfd and the comparison voltage Vr, and a capacitor 242 and a resistor 243 connected in series between an input node N2 and an output node N3 of the comparator 241. The comparator 240 feeds back the output signal to the input node N2 through the capacitor 242 and the resistor 243, and may adjust the gain of the output signal with respect to the detection voltage Vpdf accordingly.

The VCO 250 may generate the supply clock CLKO having a variable frequency to be proportional to the voltage of the output signal of the comparator 240.

According to some embodiments, the phase delay controller 200 may further include a low pass filter unit 230. The low pass filter unit 230 is connected between the output terminal of the phase frequency detector 220 and the input node N2 of the comparator 240, and may perform low-pass filtering of the detection voltage Vpdf. For example, the low pass filter unit 230 may perform low-pass filtering of the detection voltage Vpdf and output the filtering voltage Vlp.

The low pass filter unit 230 may include a resistor (Rf) 231 connected in series to the output terminal of the phase frequency detector 220 and the input node (N1=N2) of the comparator 240, and a capacitor (Cf) 232 connected between the input node (N1=N2) of the comparator and the ground voltage terminal GND.

According to some embodiments, the phase delay controller 200 may further include a frequency distribution circuit 260. When the switching converter (e.g., 101) to which the phase delay controller 200 is connected has a distributed frequency relative to the clock generated by the VCO 250, the frequency distribution circuit 260 divides the initial supply clock generated by the VCO 250 to output a frequency-adjusted supply clock.

Figure 7:
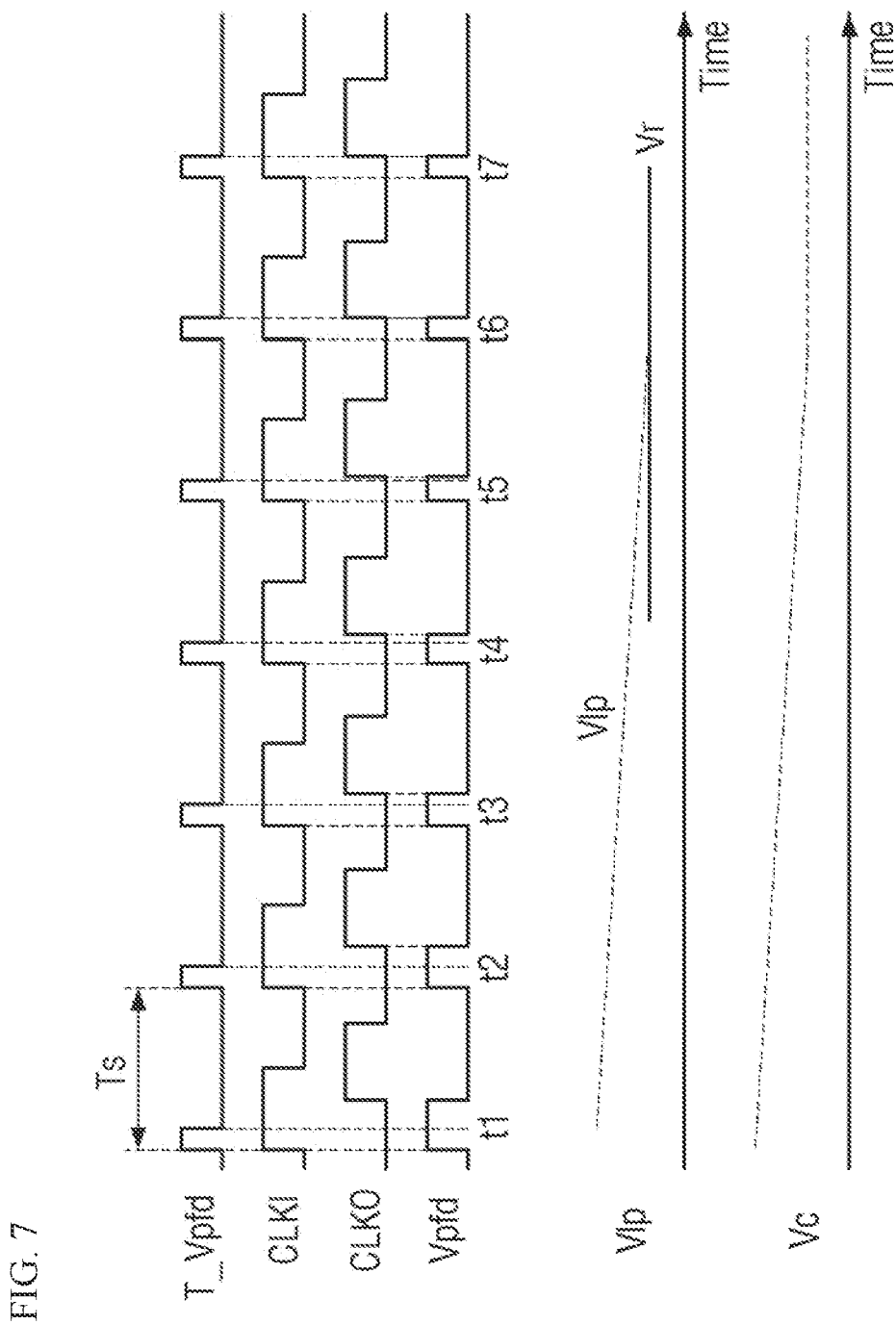
FIG. 7 is a timing diagram for explaining the operation of the power management integrated circuit of FIG. 1.
Figure 8:
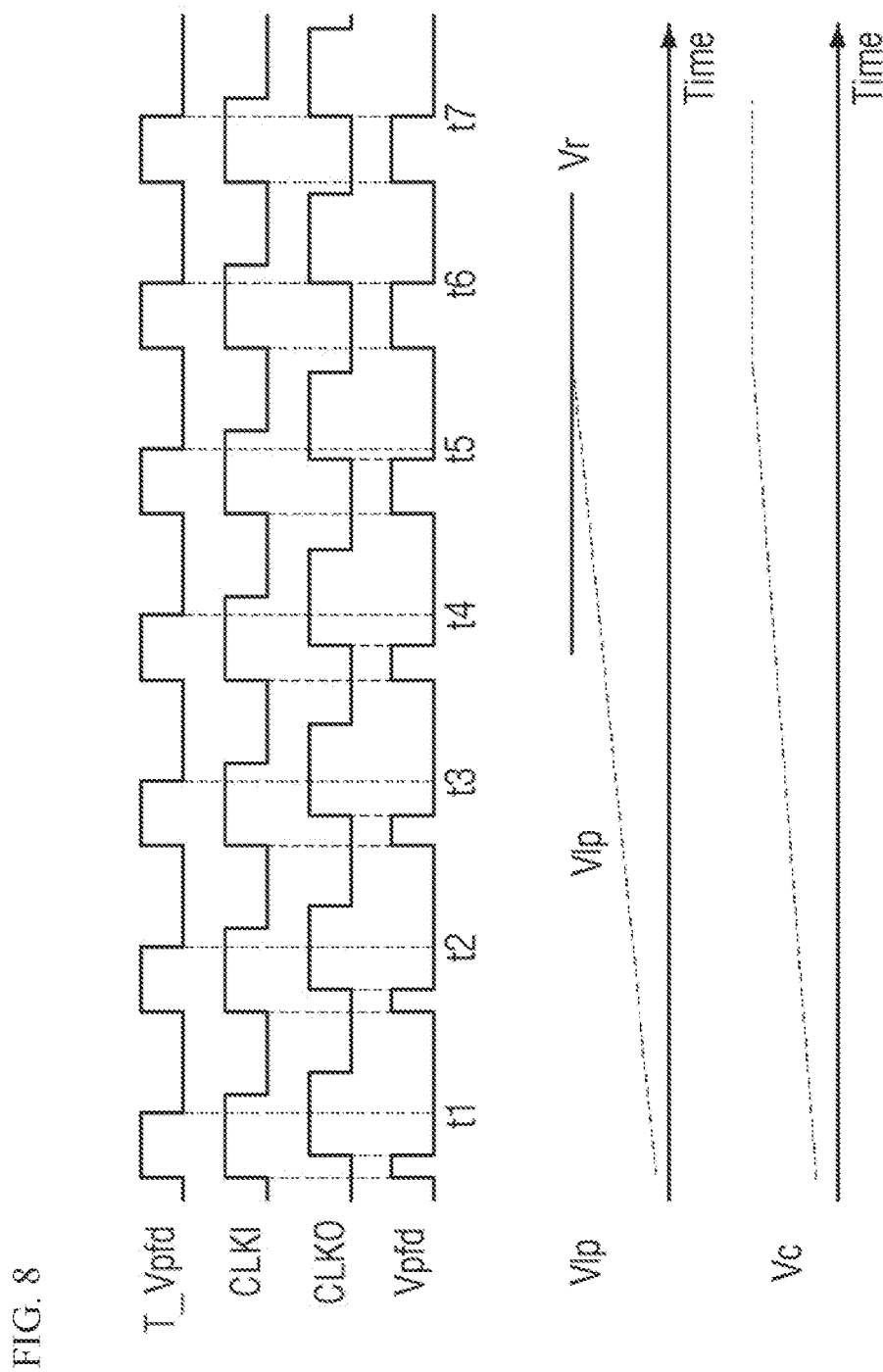
FIG. 8 is a timing diagram for explaining the operation of the power management integrated circuit of FIG. 1.

FIG. 7 is a timing diagram for explaining the operation of the power management integrated circuit of FIG. 1 according to some embodiments of the present inventive concept, and FIG. 8 is a timing diagram for explaining the operation of the power management integrated circuit of FIG. 1 according to some embodiments of the present inventive concept.

Referring to FIGS. 6 and 7, a target detection voltage having a preset target phase delay in the input clock CLKI is set as T_Vpfd. The supply clock CLKO appears with a certain time delay in comparison to the input clock CLKI within the unit period Ts of the clock signal.

At time t1, the supply clock CLKO is output from the power management integrated circuit 100-1 with a considerable delay compared to the input clock CLKI. In other words, the phase difference between the input clock CLKI and the output clock CLKO is greater than the target phase difference (e.g., logic high section T_Vpfd<Vpfd). However, the power management integrated circuit 100-1 generates an average voltage Vlp obtained by low pass-filtering the detection voltage Vpfd corresponding to the phase difference between the input clock CLKI and the supply clock CLKO at time t1, and compares the average voltage Vlp with a comparison voltage Vr corresponding to the target detection voltage T_Vpfd. The detection voltage VC, which is the result of the comparison, operates to decrease from a high voltage to a low voltage from time t1 to t7, and thus, the operating frequency of the VCO 250 increases. The operating frequency of the VCO 250 is adjusted to correspond to a preset phase difference like that shown at time t6. For example, during a section in which the target detection voltage Vpfd is logic high, the phase difference between the input clock CLKI and the output clock CLKO is controlled to match the preset phase difference and be maintained. In other words, at time t6, the phase difference between the input clock CLKI and the output clock CLKO is controlled to match the preset phase difference and at time t7, maintained.

Referring to FIGS. 6 and 8, even when the phase difference between the input clock CLKI and the output clock CLKO is smaller than the target phase difference, the comparison voltage Vr and the detection voltage Vc are similarly compared and controlled to match the preset phase difference. Although the logic high section of the detection voltage Vpfd is narrower than the logic high section of the target detection voltage T_Vpfd at the time t1, the detection voltage Vpfd matches the target detection voltage T_Vpfd toward the time t7. For example, as time proceeds from the time t1 to the time t7, the logic high section of the detection voltage Vpfd increases to eventually match the logic high section of the target detection voltage T_Vpfd at the time t7.

In other words, the detection voltage Vc, which is the result of the comparison, operates to decrease from a low voltage to a high voltage from time t1 to time t7, and thus, the operating frequency of the VCO 250 decreases. As a result, the phase difference between the input clock CLKI and the output clock CLKO is controlled to match a preset phase difference and be maintained.

Figure 9:
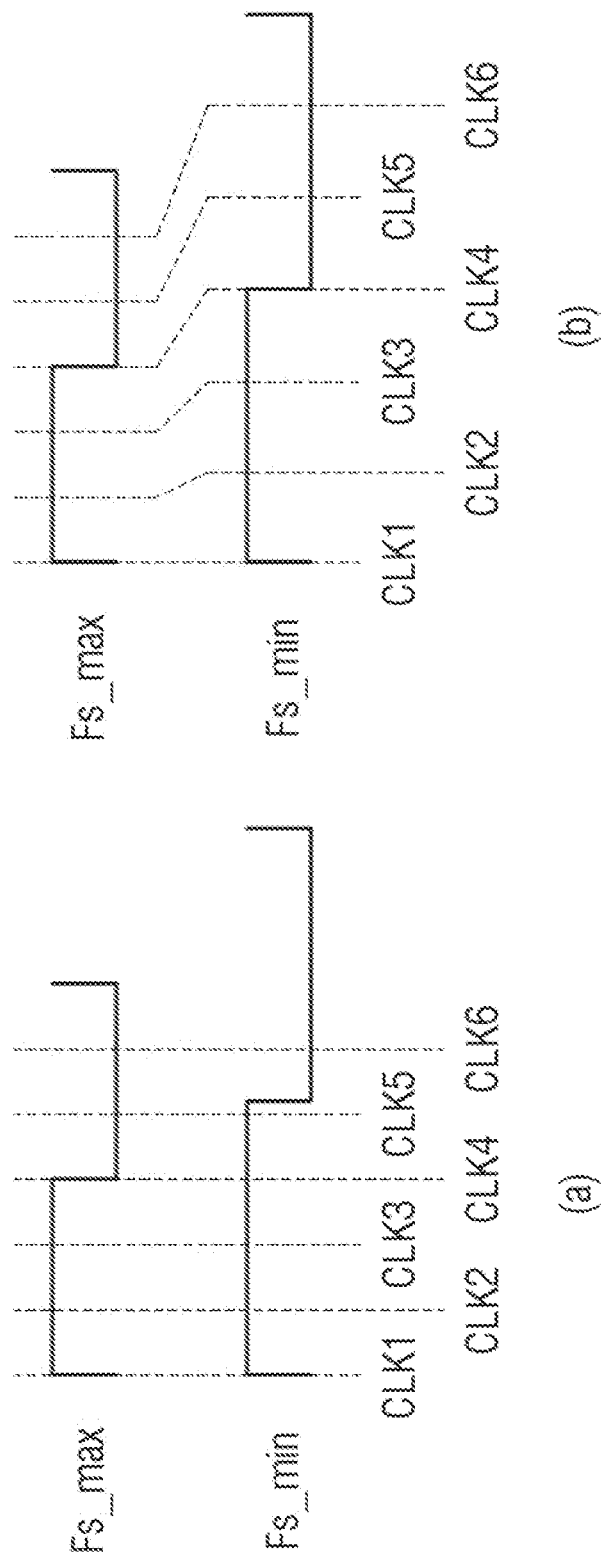
FIG. 9 is a timing diagram for explaining the operation of the power management integrated circuit according to some embodiments of the present inventive concept.

FIG. 9 is a timing diagram for explaining the operation of the power management integrated circuit according to some embodiments of the present inventive concept.

Referring to FIGS. 6 and 9, the comparison voltage Vr of the comparison voltage generator 210 is input to a non-inverting terminal of the comparator 240 and becomes the reference value for the target phase difference as described above. A phase difference of the comparison voltage Vr may be expressed as in Formula (1).

$$\Delta\phi = \frac{Vr \times T_S}{VDD} \qquad \text{<Formula 1>}$$

In Formula 1, $\Delta\phi$ corresponds to the phase difference, Vr is the comparison voltage, Ts is the period of the input clock CLKI, and VDD is the power supply voltage. In Formula 1, the phase difference $\Delta\phi$ is proportional to the comparison voltage Vr and the period Ts of the clock. Therefore, even if the period Ts of the input clock CLKI is variable, the phase difference $\Delta\phi$ also is variable at the same rate.

For example, when the frequency of the input clock CLKI fluctuates from Fs_Max to Fs_min, it may initially appear as shown in FIG. 9(*a*). However, if the phase difference between the input clock CLKI and the output clock CLKO is different from the target phase difference, the power management integrated circuit adjusts the target phase difference set by the feedback, and in that process, it is inversely proportional to the frequency change of the input clock (e.g., the frequency is the reciprocal of Ts), and the phase may be delayed by varying the ratio as in FIG. 9(*b*).

Figure 10:
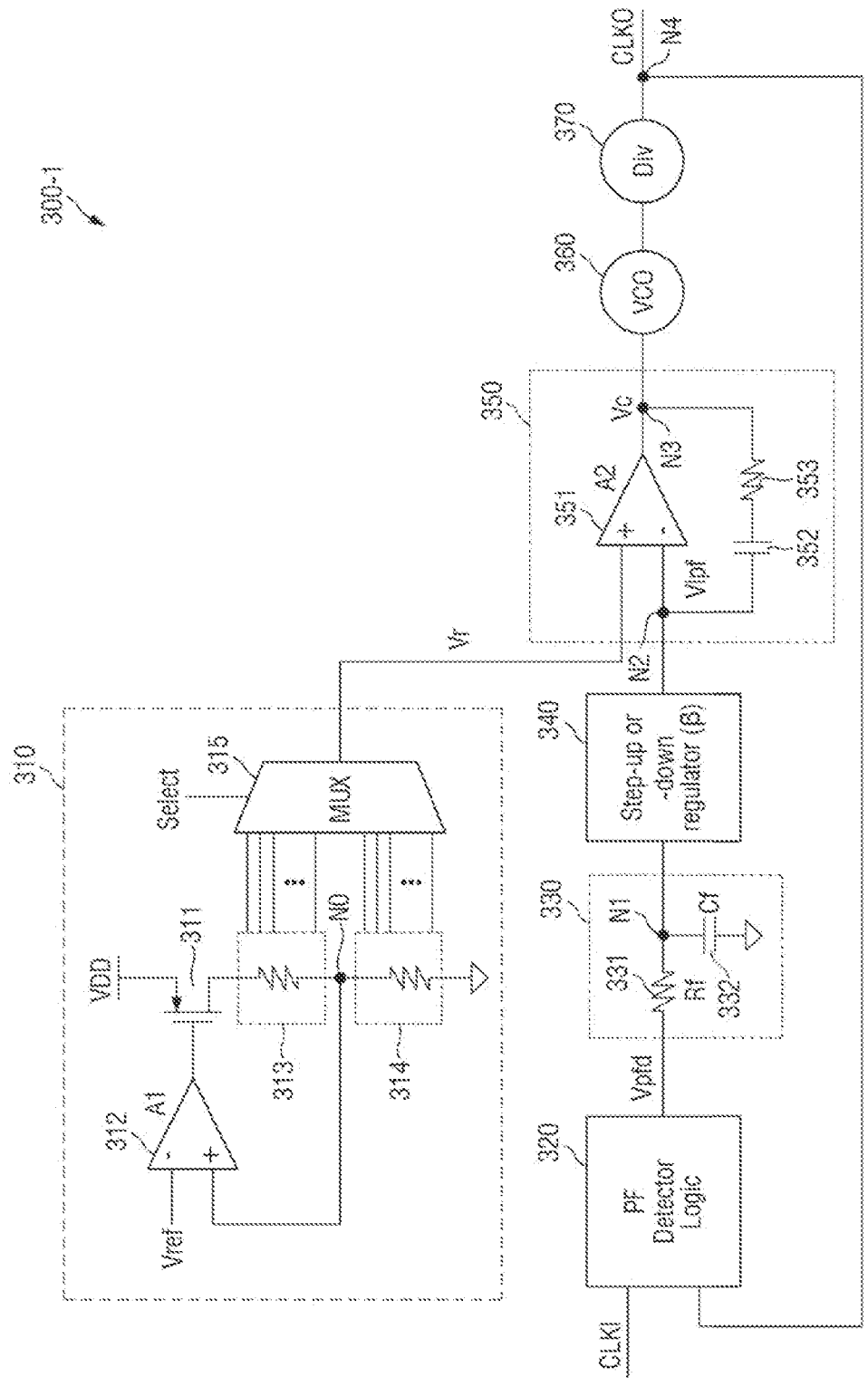
FIGS. 10 and 11 are circuit diagrams of the phase delay controller according to some embodiments of the present inventive concept.
Figure 11:
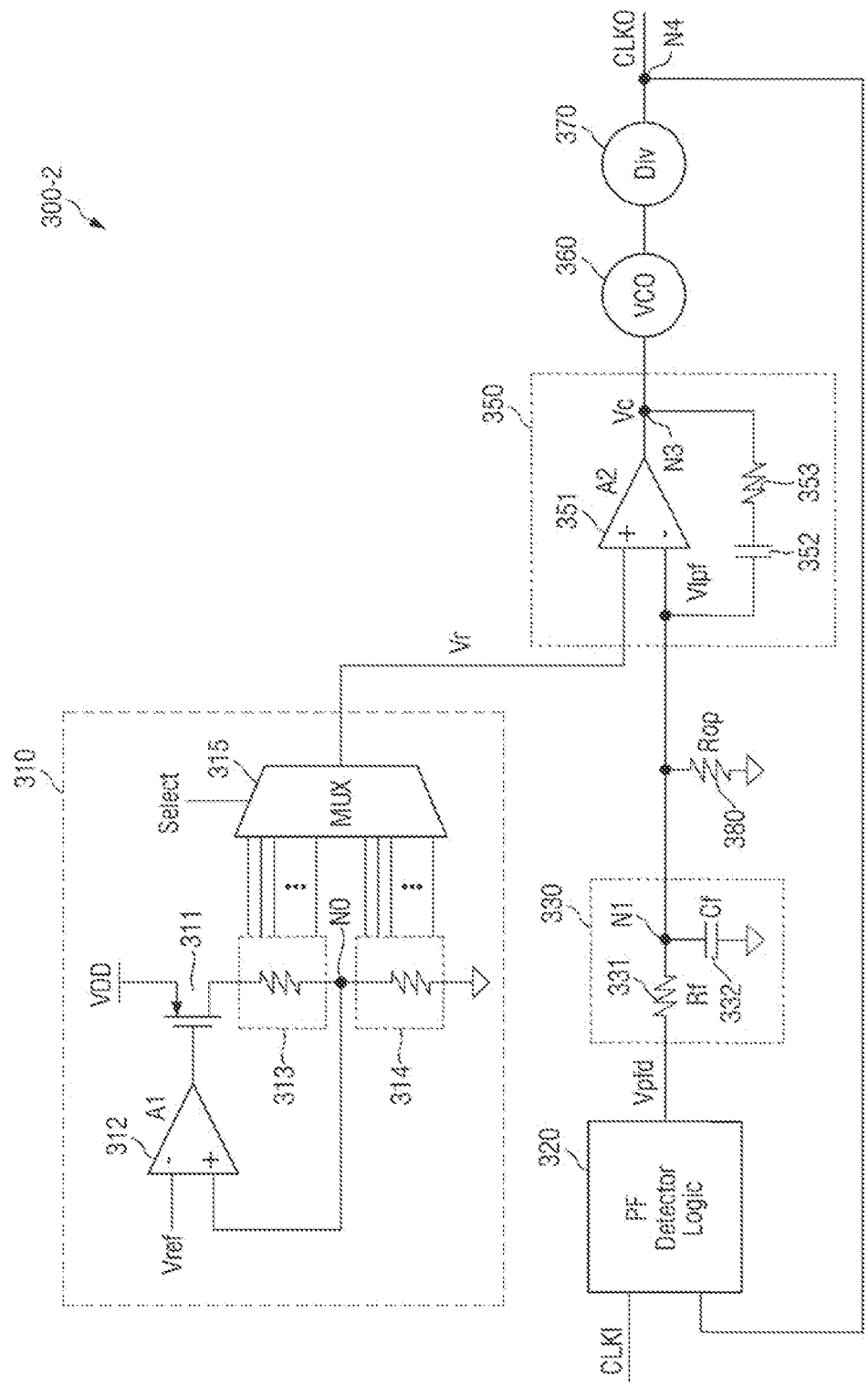

FIGS. 10 and 11 are circuit diagrams showing the phase delay controller according to some embodiments of the present inventive concept.

Referring to FIGS. 10 and 11, phase delay controllers 300-1 and 300-2 include a comparison voltage generator 310, a phase frequency detector 320, a comparator 350 and a voltage controlled oscillator (VCO) 360. For the sake of convenience, repeated description of contents of FIG. 2 will not be provided, and the description will focus on the points of difference. It is to be understood, however, that the elements of FIGS. 10 and 11 that correspond to those shown in FIG. 6 are noted with a '3' instead of a '2' at the beginning.

According to some embodiments, the phase delay controllers 300-1 and 300-2 may further include a low pass filter unit 330. According to some embodiments, the phase delay controller 300 may further include a frequency distribution circuit 370.

According to some embodiments, a regulator 340 may control the output voltage of the low pass filter portion 330. According to some embodiments, the phase delay controller 300 of FIG. 10 may further include the regulator 340. For example, the regulator 340 may output the filtering voltage Vlpf at the output node N1 of the low pass filter unit 330 after amplifying or reducing it by a preset gain β, and the phase difference $\Delta\phi$ between the input clock CLKI and the output clock CLKO may be expressed as in Formula 2 accordingly.

$$\Delta\phi = \frac{Vr \times T_S}{VDD \times \beta} \qquad \text{<Formula 2>}$$

By setting the comparison voltage Vr based on the target phase difference $\Delta\phi$, the frequency of the input clock ($f_s=1/T_s$), and the gain β as in Formula 2, the phase delay controller 300 may provide the switching converters 101 to 107 with the supply clock CLKO having different phase delays from each other.

Alternatively, the phase delay controller 300 of FIG. 11 according to some embodiments may further include a control resistor 380 for controlling the output voltage of the low pass filter unit 330. The control resistor 380 may be implemented with a simple structure without the need for additional amplifiers. For example, with respect to the filtering voltage Vlpf at the output node N1 of the low pass filter unit 330, the control resistor 380 may output the filtering voltage Vlpf corresponding to the preset resistance value Rop by amplifying or reducing the filtering voltage Vlpf. Therefore, the phase difference $\Delta\phi$ between the input clock CLKI and the output clock CLKO may be expressed as in Formula 3.

$$\Delta\phi = \frac{Vr \times T_S}{VDD} \times \frac{Rop + R}{Rop} \qquad \text{<Formula 3>}$$

As in Formula 3, the comparison voltage Vr is set based on the target phase difference $\Delta\phi$, the frequency of input clock ($f_s=1/T_s$), and the ratio $$\frac{Rop + Rf}{Rop}$$

of a filter resistor 331 and a control resistor 380 included in the low pass filter unit 330. Therefore, the phase delay controller 300 may adjust the comparison voltages of each of the switching converters 101 to 107 to provide the supply clocks CLKO having different phase delays from each other.

Figure 12:
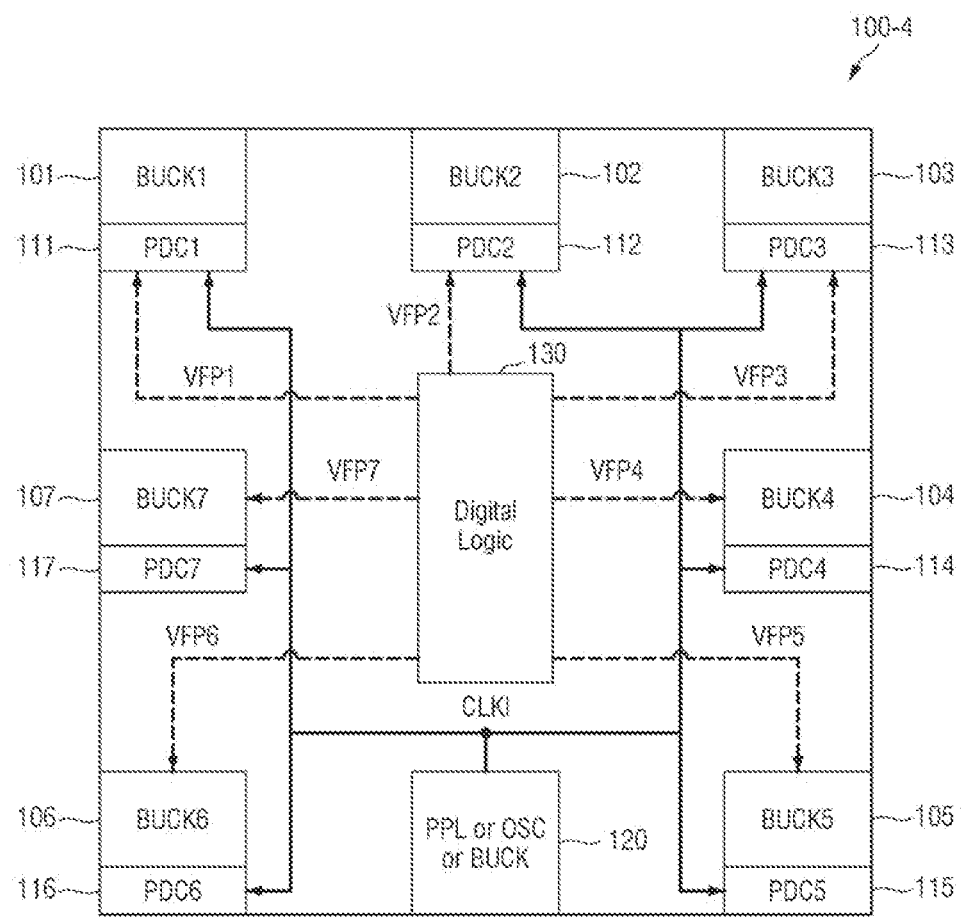
FIG. 12 is a diagram showing a power management integrated circuit according to some embodiments of the present inventive concept.
Figure 13:
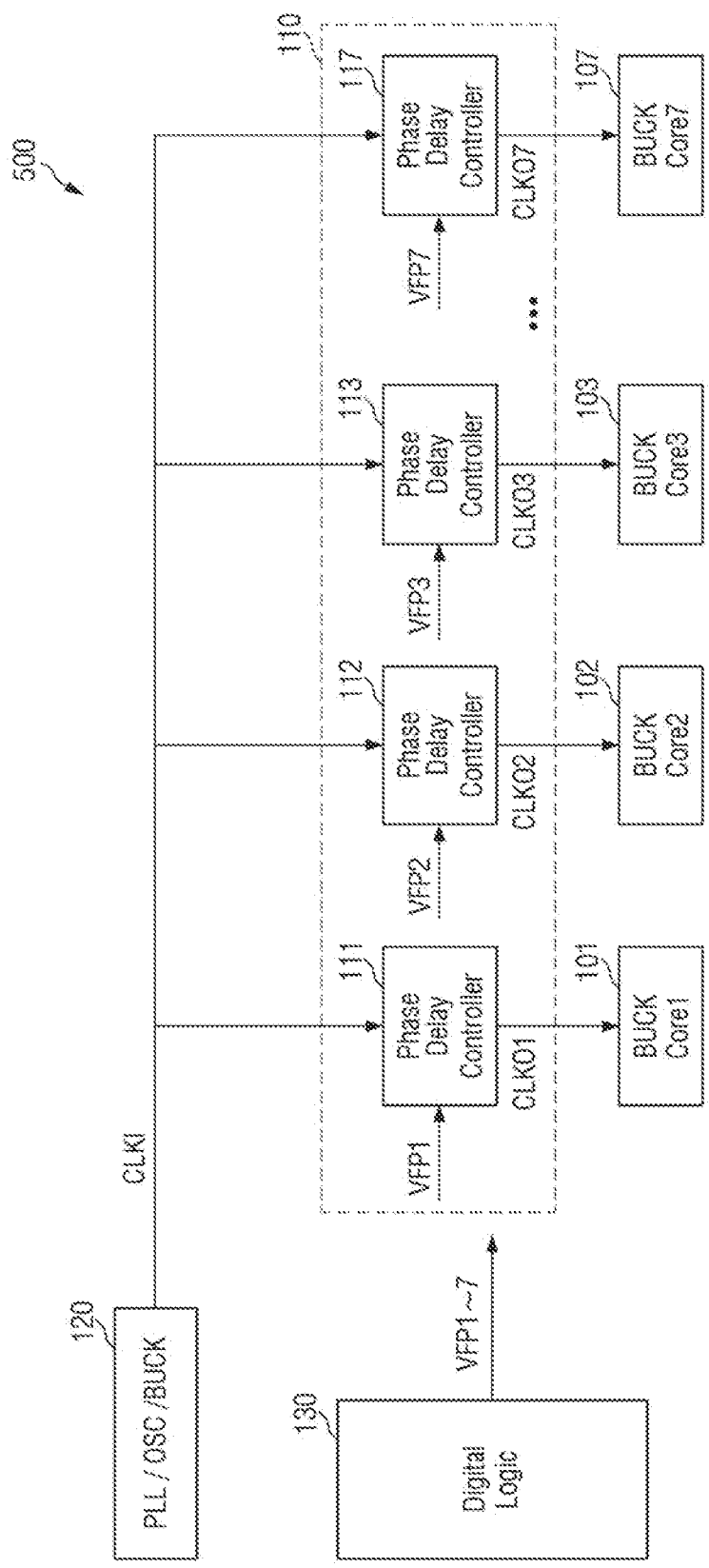
FIG. 13 is a diagram showing the power management integrated circuit of FIG. 12.

FIG. 12 is a diagram showing a power management integrated circuit according to some embodiments of the present inventive concept, and FIG. 13 is a diagram showing the power management integrated circuit of FIG. 12 according to some embodiments of the present inventive concept.

Referring to FIGS. 12 and 13, a power management integrated circuit 100-4 may further include a digital logic circuit 130 that outputs a selection signal to each of the phase delay controllers 111 to 117, unlike FIG. 1 or 2. The selection signal may be an analog signal according to some embodiments.

The phase delay controllers 111 to 117 are provided with the input clock CLKI from the clock generator 120, and receive a frequency pattern $V_{FP}$ (e.g., VFP1, VFP2, VFP3, VFP4, VFP5, VFP6, and VFP7) as a selection signal from the digital logic circuit 130. For example, in the example shown in FIGS. 12 and 13, the digital logic circuit 130 may output frequency patterns, which are analog signals, to the phase delay controllers 111 to 117. For example, the phase delay controller 111 may receive a first frequency pattern VFP1 and the phase delay controller 111 may receive a seventh frequency pattern VFP7.

The phase delay controllers 111 to 117 delay the phase to correspond to the delay codes Delay_set 1 to 7 <k:1> of the input clock CLKI, and may provide it to the switching converters 101 to 107. For example, the phase delay controller 111 may provide a first phase delayed output clock CLKO1 to the switching convertor 101 and may provide a seventh phase delayed output clock CLKO7 to the switching converter 107.

Figure 14:
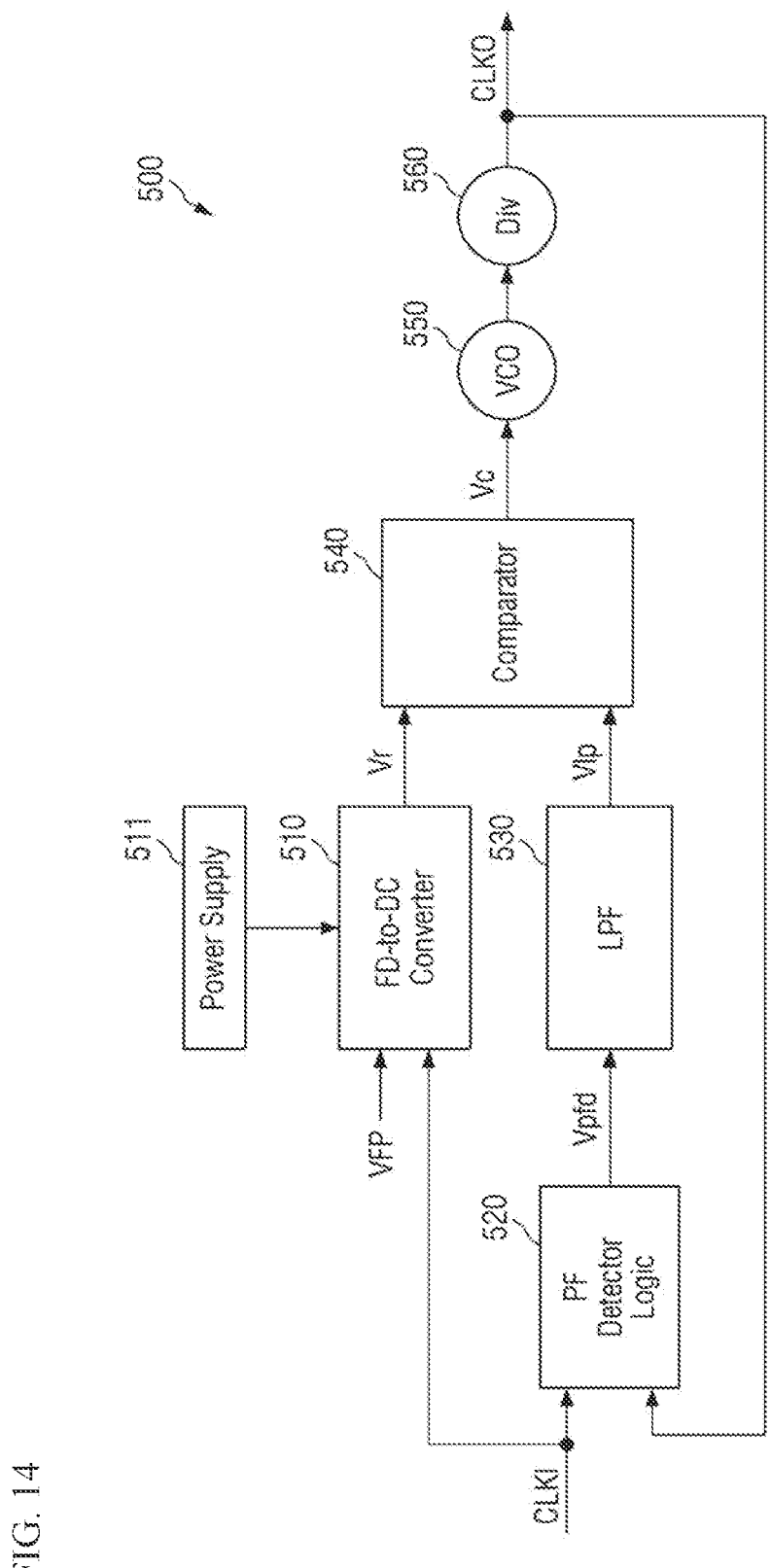
FIG. 14 is a circuit diagram showing the phase delay controller according to some embodiments of the present inventive concept.

FIG. 14 is a circuit diagram showing the phase delay controller according to some embodiments of the present inventive concept.

In one embodiment, the phase delay controllers 111 to 117 may be implemented like the phase delay controller 500 of FIG. 14. The phase delay controller 500 may include a frequency voltage converter 510, a phase frequency detector 520, a comparator 540, and a voltage controlled oscillator (VCO) 550.

The frequency voltage converter 510 generates a comparison voltage Vr corresponding to the frequency pattern $V_{FP}$. The phase frequency detector 520 receives the input clock CLKI and the supply clock CLKO fed back from the output terminal of the phase delay controller 500, and outputs a detection voltage Vpfd corresponding to the frequency difference and phase difference between the input clock CLKI and the supply clock CLKO.

The comparator 540 compares the detection voltage Vpfd with the comparison voltage Vr and outputs a comparison result, and the VCO 550 outputs the supply clock CLKO according to the comparison result of the comparator 540.

According to some embodiments, the phase delay controller 500 may further include a low pass filter unit 530. The detection voltage Vpfd output from the phase frequency detector 520 may be subjected to low-pass filtering. In other words, an average of the output initial detection voltages Vpfd generated by the phase frequency detector 520 is generated as the filtered detection voltage Vlp.

According to some embodiments, the phase delay controller 500 may further include a frequency distribution circuit 560 at the output terminal. Depending on the operating frequencies required by the connected switching converters 101 to 107, the frequency distribution circuit 560 may divide the initial supply clock CLKO output from the VCO 550 to match the switching converter.

Figure 15:
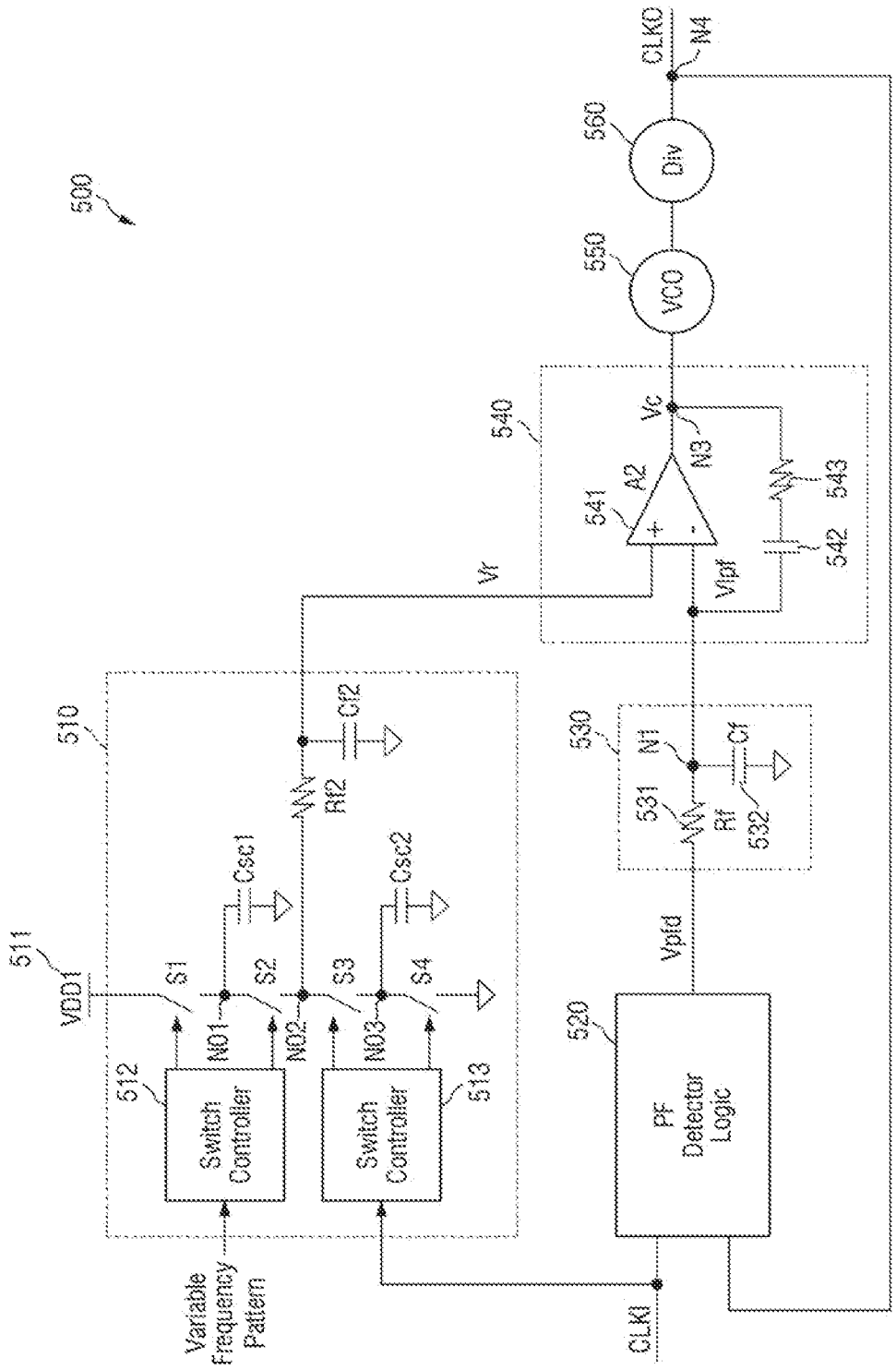
FIG. 15 is an example of the phase delay controller of FIG. 14.

FIG. 15 is an embodiment of the phase delay controller of FIG. 14.

In an embodiment, the phase delay controller 500 of FIG. 14 may be implemented like the phase delay controller 500 of FIG. 15.

The frequency voltage converter 510 is connected between a power voltage terminal 511 and a ground voltage terminal GND, receives an input clock CLKI and a frequency pattern $V_{FP}$, and outputs a comparison voltage Vr.

According to some embodiments, the frequency voltage converter 510 includes first switch columns S1 and S2 connected between the power supply voltage 511 and an output node N02, second switch columns S3 and S4 connected between the output node N02 and the ground voltage, a first switch controller 512 which controls switch turn-on/turn-off of the first switch columns S1 and S2 to correspond to the frequency pattern $V_{FP}$, and a second switch controller 513 that controls switch turn-on/turn-off of the second switch columns S3 and S4 to correspond to the input clock CLKI.

The frequency voltage converter 510 also includes a first capacitor Csc1 connected to a first common node N01 of the first switch column S1 and S2, and a second capacitor Csc2 connected to a second common node N03 of the second switch column S3 and S4.

The first switch columns S1 and S2 and the second switch columns S3 and S4 are turned on/off alternately, without being turned on simultaneously or turned off simultaneously. In other words, the first switch controller 512 based on the frequency pattern VFP and the second switch controller 513 based on the input clock CLKI alternately activate the switches coupled thereto to charge the electric charges in the first capacitor Csc1 or the second capacitor Csc2 and then output the electric charges to the output node N02, thereby generating an initial comparison voltage corresponding to the frequency pattern VFP.

In addition, the frequency voltage converter 510 may include a converter low pass filter 530 connected between the output node N02 and the input terminal of the comparator 540 to filter the initial comparison voltage and output it as the comparison voltage Vr. The converter low pass filter may include a parallel-connected capacitor Cf2 and a resistor Rf2 connected in series between the output node N02 and the input terminal of the comparator 540.

Since the phase frequency detector 520, the comparator 540, the voltage controlled oscillator (VCO) 550, the low pass filter 530, and the frequency distribution circuit 560 overlap the description of FIG. 6 or the like, detailed description thereof will not be provided. It is to be understood, however, that the elements of FIGS. 14 and 15 that correspond to those shown in FIG. 6 are noted with a '5' instead of a '2' at the beginning.

The phase delay controller 500 may amplify the low-pass filtered detection voltage with a preset gain and input it to the comparator 540 according to some embodiments. For example, the phase delay controller 500 may further include the regulator 340 as described in FIG. 10. Alternatively, for example, the phase delay controller 500 may further include the control resistors 380 as described in FIG. 11.

Figure 16:
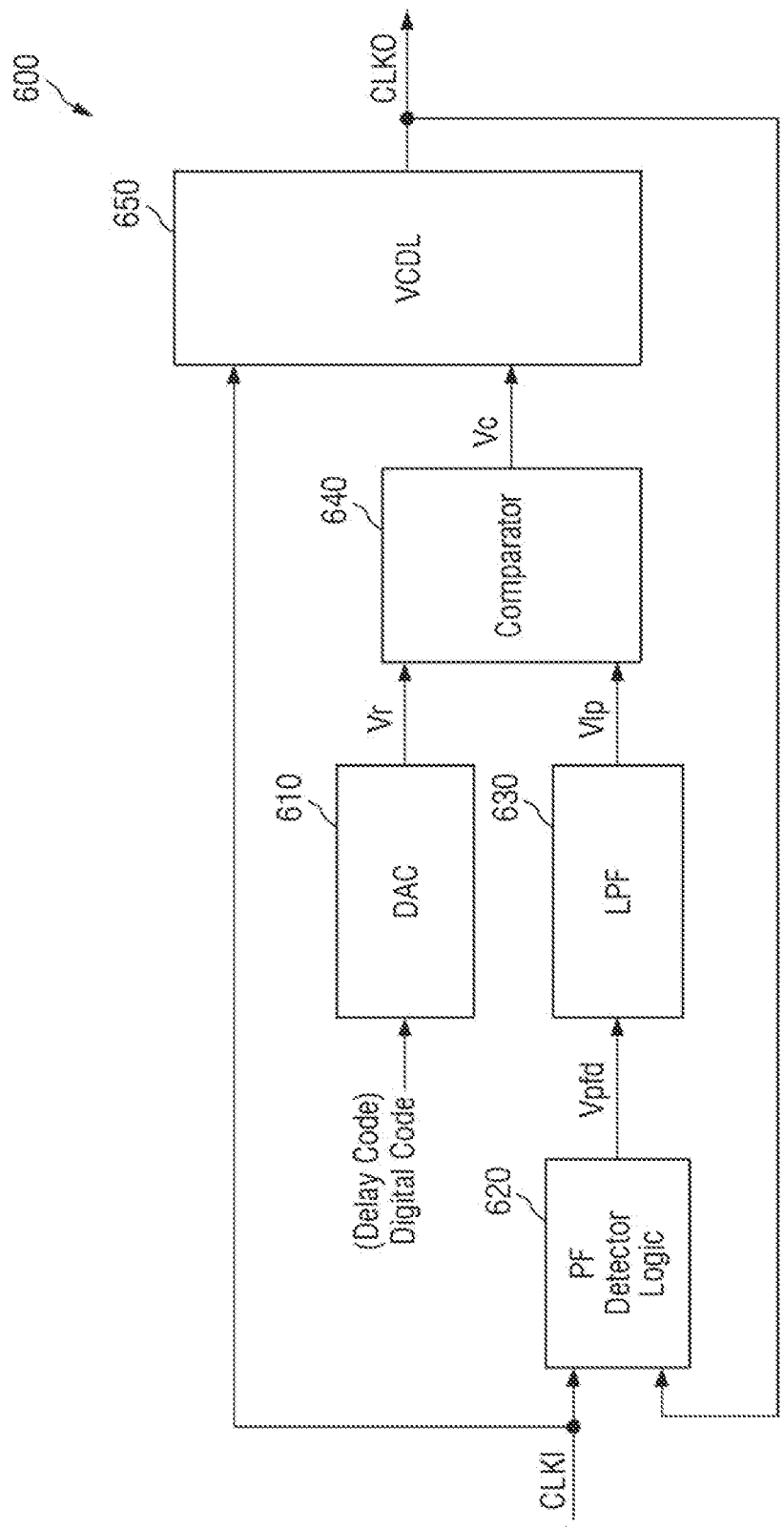
FIG. 16 shows an example of a phase delay controller according to some embodiments of the present inventive concept.

FIG. 16 shows an example of a phase delay controller according to some embodiments of the present inventive concept. It is to be understood, however, that the elements of FIG. 16 that correspond to those shown in FIG. 5 are noted with a '6' instead of a '4' at the beginning.

Referring to FIG. 16, a phase delay controller 600 may include a digital analog converter 610, a phase frequency detector 620, a low pass filter 630, a comparator 640, and a voltage controlled delay logic (VCDL) 650 according to some embodiments. Regarding the digital analog converter 610, the phase frequency detector 620, the low pass filter 630, and the comparator 640, repeated description of contents of FIG. 6 will not be provided.

The VCDL 650 may delay the input clock CLKI according to the output signal Vc of the comparator 640 to generate the current supply clock CLKO, In this case, unlike the previous embodiment, because a polarity that may occur in the VCO (e.g., 360) may be removed, a high-speed operation bandwidth can be secured.

According to some embodiments, the VCDL 650 may be used in place of the VCO 550 in FIG. 15. For example, the phase delay controller 500 using the frequency pattern may be implemented to include a frequency voltage converter 510, a phase frequency detector 520, a comparator 540, and a VCDL.

In concluding the detailed description, those skilled in the art will appreciate that many variations and modifications may be made to the embodiments set forth herein without substantially departing from the principles of the present inventive concept. Therefore, the disclosed embodiments of the invention are used in a descriptive sense and not for purposes of limitation.

What is claimed is:

1. A power management integrated circuit, comprising:
    a clock generator that generates an input clock;
    a first phase delay controller that delays the input clock by a first phase and outputs a first supply clock to a first switching converter;
    a second phase delay controller that delays the input clock by a second phase and outputs a second supply clock to a second switching converter; and
    a third phase delay controller that delays the input clock by a third phase and outputs a third supply clock to a third switching converter,
    wherein the input clock input to the first phase delay controller, the second phase delay controller, and the third phase delay controller has the same phase,
    wherein the first phase, the second phase and the third phase have different phases from each other,
    wherein the first to third phase delay controllers output the first to third supply clocks based on different first, second and third selection signals from each other,
    wherein the first, second and third selection signals are separately provided.

2. The power management integrated circuit of claim 1, wherein each of the first to third phase delay controllers includes:
    a comparison voltage generator that generates comparison voltages each corresponding to a selection signal;
    a phase frequency detector that generates a detection voltage based on a phase and a frequency of the input clock and a previous supply clock;
    a comparator that compares the comparison voltage with the detection voltage; and
    a Voltage-Controlled Oscillator (VCO) that generates a current supply clock based on an output signal of the comparator.

3. The power management integrated circuit of claim 2, wherein each of the first to third phase delay controllers further comprises a low pass filter connected between the phase frequency detector and the comparator to filter the detection voltage.

4. The power management integrated circuit of claim 3, wherein each of the first to third phase delay controllers further includes a regulator connected between the low pass filter unit and the comparator to amplify the filtered detection voltage by a preset gain and output the amplified filtered detection voltage.

5. The power management integrated circuit of claim 3, wherein each of the first to third phase delay controllers further includes a control resistor connected to an output node of the low pass filter, and each of the first to third phase delay controllers amplifies the filtered detection voltage by a ratio based on a filter resistance of the low pass filter and a distribution resistance and outputs the amplified filtered detection voltage.

6. The power management integrated circuit of claim 2, further comprising:
    a frequency distribution circuit that divides a frequency of the current supply clock output from the VCO by a preset division ratio and outputs a divided supply clock.

7. The power management integrated circuit of claim 2, wherein the comparison voltage generator includes:
    a positive-channel metal oxide semiconductor (PMOS) transistor having a source terminal connected to a power supply voltage;
    a comparator that compares voltage of a feedback node with a reference voltage and applies a result of the comparison to a gate of the PMOS transistor;
    a first resistor string connected between a drain terminal of the PMOS transistor and the feedback node;
    a second resistor string connected between the feedback node and a ground terminal; and
    a multiplexer connected to the first resistor string and the second resistor string to generate the comparison voltage in response to the selection signal.

8. The power management integrated circuit of claim 1, further comprising:
    a digital logic circuit that outputs first, second and third delay codes, wherein the first, second and third delay codes correspond to the first, second and third selection signals, respectively,
    wherein the first phase delay controller is delayed to the first phase according to the first delay code,
    the second phase delay controller is delayed to the second phase according to the second delay code, and
    the third phase delay controller is delayed to the third phase according to the third delay code.

9. The power management integrated circuit of claim 8, wherein each of the first to third phase delay controllers includes:
    a digital to analog converter that generates a comparison voltage corresponding to one of the delay codes;
    a phase frequency detector that generates a detection voltage based on a phase and a frequency of the input clock and a previous supply clock;
    a comparator that compares the comparison voltage with the detection voltage; and
    a Voltage-Controlled Oscillator (VCO) that generates a current supply clock based on an output signal of the comparator.

10. The power management integrated circuit of claim 8, wherein the first to third delay codes are digital codes of at least two bits.

11. The power management integrated circuit of claim 8, wherein each of the first to third phase delay controllers includes:
    a digital to analog converter that generates a comparison voltage corresponding to one of the delay codes;
    a phase frequency detector that generates a detection voltage based on a phase and a frequency of the input clock and a previous supply clock;
    a comparator that compares the comparison voltage with the detection voltage; and
    a Voltage-Controlled Delay Logic (VCDL) that delays the input clock based on an output signal of the comparator to generate a current supply clock.

12. A power management integrated circuit, comprising:
a clock generator that generates an input clock;
a digital logic circuit that generates first and second delay signals;
a first phase delay controller that delays the input clock by a first phase according to the first delay signal and outputs a first supply clock to a first switching converter; and
a second phase delay controller that delays the input clock by a second phase according to the second delay signal and outputs a second supply clock to a second switching converter,
wherein the first supply clock and the second supply clock are adjusted by the first and second phase delay controllers.

13. The power management integrated circuit of claim 12, wherein the first and second delay signals are analog signals having different frequency patterns from each other.

14. The power management integrated circuit of claim 13, wherein each of the first and second phase delay controllers includes:
a frequency voltage converter that generates a comparison voltage corresponding to the input clock and the first or second delay signal;
a phase frequency detector that generates a detection voltage based on a phase and a frequency of the input clock and a previous supply clock;
a comparator that compares the comparison voltage with the detection voltage; and
a Voltage-Controlled Oscillator (VCO) that generates a current supply clock according to an output signal of the comparator.

15. The power management integrated circuit of claim 14, wherein the frequency voltage converter includes:
a first switch unit connected between a power supply voltage and a first output node;
a second switch unit connected between the first output node and a ground voltage;
a first switch controller that controls turning-on/turning-off of the first switch unit in response to the first or second delay signal; and
a second switch controller that controls turning-on/turning-off of the second switch unit in response to the input clock,
wherein the frequency voltage converter outputs an initial comparison voltage to the first output node according to the first or second delay signal.

16. The power management integrated circuit of claim 15, further comprising:
a first capacitor connected to a first common node of the first switch unit; and
a second capacitor connected to a second common node of the second switch unit.

17. The power management integrated circuit of claim 16, further comprising:
a converter low pass filter connected between the first output node and an input terminal of the comparator to filter the initial comparison voltage and output the filtered initial comparison voltage as the comparison voltage.

18. A power management integrated circuit, comprising:
a first phase delay controller that adaptively delays an input clock by a first phase to generate a first supply clock;
a first switching converter that performs a voltage conversion based on the first supply clock;
a second phase delay controller that adaptively delays the input clock by a second phase to generate a second supply clock; and
a second switching converter that performs voltage conversion based on the second clock supply,
wherein the input clock input to the first phase delay controller, and the second phase delay controller has the same phase,
wherein the first and second phase delay controllers output the first and second supply clocks based on different first and second selection signals from each other, wherein the first and second selection signals are separately provided.

19. The power management integrated circuit of claim 18, wherein the first or second phase delay controller includes:
a comparison voltage generator that generates a comparison voltage corresponding to the first selection signal or the second selection signal;
a phase frequency detector that generates a detection voltage;
a comparator that compares the comparison voltage with the detection voltage; and
a Voltage-Controlled oscillator (VCO) that generates the first or second supply clock according to an output signal of the comparator,
wherein the phase frequency detector generates a detection voltage according to the input clock and a clock signal output from the VCO.

20. The power management integrated circuit of claim 18, further comprising:
a digital logic that outputs a first digital code and a second digital code, wherein the first digital code and the second digital code correspond to the first and second selection signals, respectively,
wherein each of the first phase delay controller and the second phase delay controller include:
a digital analog converter that generates a comparison voltage corresponding to the first digital code or the second digital code;
a phase frequency detector that generates a detection voltage based on a phase and a frequency of the input clock and a previous supply clock;
a comparator that compares the comparison voltage with the detection voltage; and
a Voltage-Controlled Oscillator (VCO) that generates a current supply clock according to an output signal of the comparator.

* * * * *